(12) United States Patent
Nakamura

(10) Patent No.: US 8,759,268 B2
(45) Date of Patent: Jun. 24, 2014

(54) SOLUTION FOR REMOVING RESIDUE AFTER SEMICONDUCTOR DRY PROCESS AND METHOD OF REMOVING THE RESIDUE USING THE SAME

(75) Inventor: Shingo Nakamura, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 809 days.

(21) Appl. No.: 12/377,995

(22) PCT Filed: Aug. 23, 2007

(86) PCT No.: PCT/JP2007/066337
§ 371 (c)(1),
(2), (4) Date: Feb. 18, 2009

(87) PCT Pub. No.: WO2008/023754
PCT Pub. Date: Feb. 28, 2008

(65) Prior Publication Data
US 2010/0248486 A1 Sep. 30, 2010

(30) Foreign Application Priority Data
Aug. 24, 2006 (JP) .................. 2006-228454

(51) Int. Cl.
*C11D 7/50* (2006.01)
*C11D 11/00* (2006.01)
*C11D 7/26* (2006.01)
*C11D 7/32* (2006.01)

(52) U.S. Cl.
CPC ............ *C11D 11/0047* (2013.01); *C11D 7/265* (2013.01); *C11D 7/3209* (2013.01)
USPC ......................................... 510/175; 510/176

(58) Field of Classification Search
CPC ... C11D 11/0047; C11D 7/265; C11D 7/3209
USPC .................................. 510/175, 176
See application file for complete search history.

(56) References Cited

U.S. PATENT DOCUMENTS

| 4,996,135 | A | * | 2/1991 | Toyama et al. ............. 430/309 |
| 5,106,414 | A | * | 4/1992 | Kunichika et al. ............. 106/2 |
| 5,165,344 | A | * | 11/1992 | Matsumoto et al. ......... 101/451 |
| 5,221,330 | A | * | 6/1993 | Matsumoto et al. ............ 106/2 |
| 5,720,800 | A | * | 2/1998 | Matsumoto .................... 106/2 |
| 5,786,490 | A | * | 7/1998 | Dietz et al. .................. 549/269 |
| 6,114,547 | A | * | 9/2000 | Baker et al. .................. 549/292 |
| 6,294,318 | B1 | * | 9/2001 | Matsumoto et al. .......... 430/331 |
| 6,307,080 | B1 | * | 10/2001 | Pischel et al. ................ 556/131 |
| 6,312,873 | B1 | * | 11/2001 | Matsumoto et al. .......... 430/309 |
| 6,593,068 | B1 | * | 7/2003 | Watanabe .................... 430/331 |
| 6,652,631 | B2 | * | 11/2003 | Itakura .............................. 106/2 |
| 6,958,289 | B2 |   | 10/2005 | Kim |
| 7,186,497 | B2 | * | 3/2007 | Suzuki .......................... 430/300 |
| 7,300,744 | B2 | * | 11/2007 | Suzuki et al. ................ 430/302 |
| 7,329,482 | B2 | * | 2/2008 | Watanabe .................... 430/331 |
| 7,543,592 | B2 | * | 6/2009 | Lee ................................ 134/1.3 |
| 7,579,308 | B2 | * | 8/2009 | Lee ............................... 510/175 |
| 7,771,781 | B2 | * | 8/2010 | Kawakami ................... 427/162 |
| 8,034,529 | B2 | * | 10/2011 | Sawabe et al. ............... 430/192 |
| 2002/0147300 | A1 | * | 10/2002 | Matsumoto .................. 528/422 |
| 2003/0106459 | A1 | * | 6/2003 | Itakura .............................. 106/2 |
| 2004/0094086 | A1 |   | 5/2004 | Shimaoka et al. |
| 2004/0152765 | A1 | * | 8/2004 | Ancira ........................... 514/460 |
| 2005/0101121 | A1 |   | 5/2005 | Kim |
| 2005/0187118 | A1 |   | 8/2005 | Haraguchi et al. |
| 2005/0211130 | A1 | * | 9/2005 | Watanabe ......................... 106/2 |
| 2005/0250058 | A1 | * | 11/2005 | Suzuki ........................... 430/434 |
| 2005/0263743 | A1 | * | 12/2005 | Lee ................................ 252/364 |
| 2005/0287480 | A1 | * | 12/2005 | Takashima ................... 430/331 |
| 2006/0094613 | A1 | * | 5/2006 | Lee ............................... 510/175 |
| 2006/0115970 | A1 | * | 6/2006 | Lee ............................... 438/584 |
| 2008/0257497 | A1 |   | 10/2008 | Shimaoka et al. |
| 2009/0214979 | A1 | * | 8/2009 | Sawabe et al. ............... 430/192 |

FOREIGN PATENT DOCUMENTS

| JP | 10-256210 A | 9/1998 |
| JP | 11-316464 A | 11/1999 |
| JP | 2001-242641 A | 9/2001 |
| JP | 2004-94203 A | 3/2004 |
| JP | 2005-209953 A | 8/2005 |
| JP | 2005-347587 A | 12/2005 |
| JP | 2006-11297 A | 1/2006 |
| JP | 2006-114872 A | 4/2006 |
| TW | I251297 B | 3/2006 |
| TW | I251626 B | 3/2006 |

* cited by examiner

*Primary Examiner* — Gregory Webb
(74) *Attorney, Agent, or Firm* — Sughrue Mion, PLLC

(57) ABSTRACT

The present invention provides a residue-removing solution for use after a dry process, the residue-removing solution being capable of preventing minute cracks on a Cu surface, which has heretofore been unresolved with known polymer-removing solutions; and a method for manufacturing semiconductor devices using the residue-removing solution. More specifically, the invention relates to a residue-removing solution for removing residues present on semiconductor substrates after dry etching and/or ashing, the solution containing water and at least one component selected from the group consisting of (a) a keto acid, (b) a keto acid salt, and (c) an aldehyde acid salt; and a method for removing residues using the residue-removing solution.

19 Claims, No Drawings ns as designed.

SOLUTION FOR REMOVING RESIDUE AFTER SEMICONDUCTOR DRY PROCESS AND METHOD OF REMOVING THE RESIDUE USING THE SAME

TECHNICAL FIELD

The present invention relates to a chemical solution for removing residues formed during dry etching and/or ashing in the manufacturing process of semiconductor devices; and a method for manufacturing semiconductor devices, wherein such residues are removed using the chemical solution. More particularly, the invention relates to a residue-removing solution for use in manufacturing Cu/low-k multilayer interconnect structures.

BACKGROUND ART

Heretofore, semiconductor devices with an Al/$SiO_2$ multilayer interconnect structure, which uses Al, Al alloy or the like as an interconnect material, and uses an $SiO_2$ film as an interlayer dielectric, have been mainly manufactured. In recent years, in order to reduce the interconnect delay caused by the miniaturization of semiconductor devices, semiconductor devices with a Cu/low-k multilayer interconnect structure, which uses Cu with low resistance as an interconnect material and a low-k film (a low dielectric constant film) with low interconnect capacitance as an interlayer dielectric, are being manufactured in large quantities.

Cu/low-k multilayer interconnect structures are produced by a process called damascene. In this process, an interconnect structure is obtained by forming trenches or holes (via holes) in an interlayer dielectric substrate, and then filling the trenches or holes with an interconnect material such as Cu.

In a process called dual damascene, trenches for an interconnect and via holes are formed continuously in an interlayer dielectric substrate made of a low-k film or the like, and then filled with an interconnect material such as Cu. A dual damascene structure can be formed by a via-first process, wherein via holes are formed prior to trenches for an interconnect; or conversely, by a trench-first process, wherein trenches for an interconnect are formed prior to via holes; or by other processes such as a middle-first process or a dual hard mask process.

In, for example, processes such as the via-first process, via holes are formed in an interlayer dielectric substrate by dry etching, and then filled with a filling material and planarized. Lithography is subsequently performed to form trenches, and dry etching follows. Ashing or a like process is performed to remove unwanted substances such as resist or filling material from the substrate having trenches and via holes.

Even after this process, however, unwanted substances (hereinafter referred to as "residues after a dry process") that cannot be completely removed remain on the substrate.

Moreover, dry processes using plasma, such as dry etching and ashing, cause damage to some portions of Cu used as the interconnect material or the low-k film as the interlayer dielectric. Further, if the substrate is exposed to air while being transferred from one process to another, a Cu oxide film is formed on the surface of the Cu metal interconnect.

In a damascene structure, when trenches and via holes are filled with metals such as TaN as a barrier metal and Cu as an interconnect material, the presence of residues after a dry process or Cu oxide film leads to defective semiconductor devices. For this reason, these residues are typically removed using a polymer-removing solution. Because the damaged low-k film is structurally more fragile than the original, it is easily etched by a chemical solution or the like, and undergoes changes in pattern dimensions. Thus, during removal of these residues, it is necessary to prevent the corrosion of Cu caused by the chemical solution, and prevent the etching of the low-k film.

When commercially available known polymer-removing solutions or etchants are used to remove the residues after a dry process and Cu oxide films, problems with workability arise. For example, the residues can be removed using hydrochloric acid or fluoric acid diluted with water, but a large number of dissociated $H^+$ tend to cause Cu corrosion. Moreover, if the interlayer dielectric (especially when it is a porous low-k film) has been damaged by dry etching, the surface condition of the interlayer dielectric may be degraded by etching, or the substrate cannot sometimes be processed to the dimensions as designed.

DISCLOSURE OF THE INVENTION

Problems to be Solved by the Invention

Dry processes are becoming more diverse to match the finer device structures or different types of low-k films. For example, in addition to known dry processes such as dry etching using a resist mask and ashing using oxygen plasma, dry processes such as dry etching using a hard mask and ashing using He/$H_2$ plasma are now being used. Along with such changes, there is a desire for the residues after a dry process and Cu oxide films to be selectively removed without damaging Cu or low-k films.

Low-k films, however, are often damaged by a dry process, and, when cleaned with a polymer-removing solution, they are easily etched and undergo changes in pattern dimensions. Although the Cu bulk is not corroded by cleaning, a close examination thereof often reveals the presence of cracks along the grain boundaries of the Cu surface. It is very likely that these minute cracks on the Cu surface adversely affect the device performance. Another cause of device defects is the growth of Cu oxide films caused by exposure of processed wafers to air after the cleaning process.

When Cu/low-k multilayer interconnect structures are formed using known chemical solutions such as hydrochloric acid and fluoric acid, it is difficult to prevent Cu corrosion and the etching of low-k films, and to selectively remove the residues after a dry process and Cu oxide films.

Polymer-removing solutions intended for Cu/low-k multilayer interconnect structures have recently been developed (for example, Patent Documents 1 to 4). With these polymer-removing solutions, however, it is difficult to prevent minute cracks from being formed on the Cu surface without damaging the low-k film.

In view of the above-described current situation, an object of the invention is to provide a chemical solution capable of removing the residues after a dry process, the chemical solution being capable of preventing the Cu surface from cracking, without damaging low-k films. Another object of the invention is to provide a method for manufacturing semiconductor devices using the chemical solution.

Patent Document 1: Japanese Unexamined Patent Publication No. 11-316464
Patent Document 2: Japanese Unexamined Patent Publication No. 2004-94203
Patent Document 3: Japanese Unexamined Patent Publication No. 2005-347587
Patent Document 4: Japanese Unexamined Patent Publication No. 2006-11297

Means for Solving the Problems

The inventor found that, when an aqueous solution containing, as a fundamental composition, water and at least one component selected from the group consisting of (a) a keto acid, (b) a keto acid salt, and (c) an aldehyde acid salt, is used, minute cracks on a Cu surface can be prevented, and residues after a dry process can be selectively removed. The inventor added further considerations to this finding, and accomplished the invention.

Specifically, the invention provides a solution for removing residues present on semiconductor substrates after dry etching and/or ashing, and a method for manufacturing semiconductor devices using such a residue-removing solution.

Item 1. A residue-removing solution for removing residues present on semiconductor substrates after dry etching and/or ashing, the solution comprising water and at least one component selected from the group consisting of (a) a keto acid, (b) a keto acid salt, and (c) an aldehyde acid salt.

Item 2. The residue-removing solution according to Item 1, wherein the concentration of the at least one component selected from the group consisting of (a) a keto acid, (b) a keto acid salt, and (c) an aldehyde acid salt in the residue-removing solution is from 0.1 to 35% by weight.

Item 3. The residue-removing solution according to Item 1 or 2, wherein (a) the keto acid is at least one keto acid selected from the group consisting of pyruvic acid, levulinic acid, 5-aminolevulinic acid, α-ketoglutaric acid, and acetonedicarboxylic acid; (b) the keto acid salt is a salt formed from at least one acid selected from the group consisting of pyruvic acid, levulinic acid, 5-aminolevulinic acid, α-ketoglutaric acid, and acetonedicarboxylic acid, and at least one base selected from the group consisting of ammonia, hydroxylamine, primary, secondary, and tertiary amines, quaternary ammonium, and polyamines; and (c) the aldehyde acid salt is a salt formed from glyoxylic acid and at least one base selected from the group consisting of ammonia, hydroxylamine, primary, secondary, and tertiary amines, quaternary ammonium, and polyamines.

Item 4. The residue-removing solution according to Item 1 or 2, wherein the at least one component selected from the group consisting of (a) a keto acid, (b) a keto acid salt, and (c) an aldehyde acid salt is a salt formed from at least one acid selected from the group consisting of pyruvic acid and levulinic acid; and at least one base selected from the group consisting of ammonia, methylamine, ethylamine, propylamine, butylamine, dimethylamine, diethylamine, trimethylamine, triethylamine, propanediamine, triethylenetetramine, tetramethylammonium hydroxide, and choline.

Item 5. The residue-removing solution according to any one of Items 1 to 4, further comprising a polycarboxylic acid salt.

Item 6. The residue-removing solution according to Item 5, wherein the concentration of the polycarboxylic acid salt in the residue-removing solution is from 0.1 to 10% by weight.

Item 7. The residue-removing solution according to Item 5 or 6, wherein the polycarboxylic acid salt is a salt formed from at least one polycarboxylic acid selected from the group consisting of oxalic acid, malonic acid, succinic acid, glutaric acid, malic acid, tartaric acid, ammonium hydrogen citrate, and citric acid; and at least one base selected from the group consisting of ammonia, hydroxylamine, primary, secondary, and tertiary amines, quaternary ammonium, and polyamines.

Item 8. The residue-removing solution according to any one of Items 1 to 7, further comprising a neutral organic compound containing an oxygen atom that can coordinate to Cu.

Item 9. The residue-removing solution according to Item 8, wherein the concentration of the neutral organic compound containing an oxygen atom that can coordinate to Cu in the residue-removing solution is from 0.1 to 60% by weight.

Item 10. The residue-removing solution according to Item 9, wherein the neutral organic compound containing an oxygen atom that can coordinate to Cu is at least one compound selected from the group consisting of polycarbonyls, esters, alcohols, and polyethers.

Item 11. The residue-removing solution according to any one of Items 8 to 10, wherein the neutral organic compound containing an oxygen atom that can coordinate to Cu is at least one compound selected from the group consisting of 2,3-butanedione, 2,4-pentadione, acetoin, propylene carbonate, γ-butyrolactone, ethylene glycol diacetate (ethylene diacetate), diethylene glycol monoethyl ether acetate, propylene glycol monomethyl ether acetate (PGMEA), propylene glycol monoethyl ether acetate, isopropyl alcohol, 1-butanol, isobutyl alcohol, diethylene glycol, dipropylene glycol, triethylene glycol, tetraethylene glycol, ethylene glycol dimethyl ether, diethylene glycol dimethyl ether, diethylene glycol diethyl ether, triethylene glycol dimethyl ether, tetraethylene glycol dimethyl ether, methyl acetoacetate, ethyl acetoacetate, and ethyl lactate.

Item 12. The residue-removing solution according to any one of Items 1 to 11, further comprising a surfactant.

Item 13. The residue-removing solution according to any one of Items 1 to 12, further comprising a fluorine compound.

Item 14. The residue-removing solution according to Item 13, wherein the fluorine compound is hydrogen fluoride, or a fluoride salt of ammonia, hydroxylamine, a primary, secondary, or tertiary amine, quaternary ammonium, or a polyamine.

Item 15. The residue-removing solution according to any one of Items 1 to 14, further comprising a crack inhibitor for Cu and/or an antioxidant for Cu.

Item 16. A method for removing residues present on semiconductor substrates after dry etching and/or ashing, the method comprising bringing a semiconductor substrate after dry etching and/or ashing into contact with the residue-removing solution of any one of Items 1 to 15.

Item 17. The method according to Item 16, wherein the semiconductor substrate has Cu as an interconnect material, and a low dielectric constant film (a low-k film) as an interlayer dielectric material.

Item 18. A method for manufacturing semiconductor devices comprising the steps of (1) subjecting a semiconductor substrate having Cu as an interconnect material, and a low dielectric constant film (a low-k film) as an interlayer dielectric material, to dry etching and/or ashing; and (2) bringing the semiconductor substrate processed in Step (1) into contact with the residue-removing solution of any one of Items 1 to 15.

The invention is described below in detail.

Residue-Removing Solution for Use after a Semiconductor Dry Process

The residue-removing solution of the invention contains, as a fundamental composition, water and at least one component selected from the group consisting of (a) a keto acid, (b) a keto acid salt, and (c) an aldehyde acid salt. The residue-removing solution can further contain a polycarboxylic acid salt, a neutral organic compound containing an oxygen atom that can coordinate to Cu, a surfactant, a fluorine compound, an antioxidant, a crack inhibitor, and the like, to further exhibit additional superior function(s).

Principal targets to be removed by the residue-removing solution of the invention are Cu oxide films and residues after a dry process.

Examples of Cu oxide films include Cu oxide formed during dry etching and/or ashing, a native oxide film resulting from oxidation of the metal when the substrate is exposed to air during transfer from one process to another, and the like. These Cu oxide films contain large amounts of CuO, $Cu_2O$, $Cu(OH)_2$, and the like in their compositions.

The residues after a dry process on a wafer on which a film is formed using Cu as a conductive metal are residues of Cu degradation products, including a Cu oxide film formed on the Cu surface of a Cu/low-k multilayer interconnect structure and/or Cu oxide formed as a result of dry etching and/or ashing. These residues typically adhere to Cu with a pattern thereon, side walls of the pattern made of an interlayer dielectric such as a low-k film, and the surface of an interlayer dielectric substrate. The residues formed on the Cu are residues of a degradation product, which is a mixture of the Cu and Cu oxide resulting from the oxidation and/or fluorination caused by dry etching and/or ashing. These residues have a large electrical resistance, and form an insulating layer similar to Cu oxide.

The residues adhering to the side walls of the pattern made of an interlayer dielectric such as a low-k film include, in addition to the Cu degradation products, residues of the stopper film such as SiN, low-k film, filling material, and the like sputtered by dry etching, and may contain Si and organic substances. The residues on the surface of the interlayer dielectric substrate presumably include small amounts of Si and Cu degradation products that jumped from the bottom of holes and trenches during dry etching, in addition to the residues of organic substances such as the resist, anti-reflection film, and filling material that have not been removed by ashing, and residues after a process using an inorganic mask.

To prevent minute cracks from forming on the Cu surface, and remove the residues after a dry process, the above-mentioned at least one component selected from the group consisting of a keto acid, a keto acid salt, and an aldehyde acid salt is required. When large amounts of residues must be removed in a short period, or the residues are so tenacious that removal requires a long period of time, a polycarboxylic acid salt may be added. To further impart the effect of preventing cracks, an amine salt of a polycarboxylic acid is preferably added. When it is difficult to remove residues adhering to the side walls of the pattern made of an interlayer dielectric such as a low-k film, a small amount of a fluorine compound or a neutral organic compound containing an oxygen atom that can coordinate to Cu may be added to increase the removal effect. When it is difficult to remove the residues on the surface of the interlayer dielectric substrate, a neutral organic compound containing an oxygen atom that can coordinate to Cu is added in some cases. After the removal of these residues, an antioxidant can be added to prevent the growth of an oxide film on the Cu surface. To enhance the effect of preventing Cu surface cracking, a crack inhibitor may further be added.

The term "interlayer dielectric" as used herein principally means a low-k film (a low dielectric constant film), but also includes, for example, a fluorine-containing silicon oxide film (a FSG film). The interlayer dielectric typically has a dielectric constant of from more than 1 to about 4 or less, preferably about 3 or less, more preferably about 2.8 or less, and still more preferably about 2.6 or less. The low-k film is typically produced by coating or plasma CVD.

Specific examples of low-k films include, but are not limited to: inorganic SOG films (HSG: hydrogenated silsesquioxane) such as LKD series (trade name; JSR Corporation), HSG series (trade name; Hitachi Chemical Co., Ltd.), Nanoglass (trade name; Honeywell), IPS (trade name; Catalysts and Chemicals Ind., Co., Ltd.), $Z_3M$ (trade name; Dow Corning), XLK (trade name; Dow Corning), FOx (trade name; Dow Corning), Orion (trade name; Tricon), NCS (trade name; Catalysts and Chemicals Ind., Co., Ltd.), and SiLK (trade name; Dow Corning); organic SOG films (MSQ film: methyl silsesquioxane film); coating films principally composed of a polyallyl ether or the like (organic polymer films); plasma CVD films typified by Black Diamond (trade name; Applied Materials), Coral (trade name; Novellus), and Aurora (trade name; ASM).

Examples of resists include, but are not limited to, KrF (Krypton F), ArF, $F_2$ resists, and the like. The filling material may be an organic compound that also functions as an anti-reflection film.

The at least one component selected from the group consisting of a keto acid (a), a keto acid salt (b), and an aldehyde acid salt (c) functions to prevent Cu corrosion, and remove the residues after a dry process. Moreover, the component is capable of preventing minute cracks on the Cu surface, in addition to its normal function of preventing the Cu bulk.

Examples of keto acids include pyruvic acid, levulinic acid, 5-aminolevulinic acid, α-ketoglutaric acid, acetonedicarboxylic acid, and the like.

Examples of keto acid salts include salts formed from the above-mentioned keto acids such as pyruvic acid, levulinic acid, 5-aminolevulinic acid, α-ketoglutaric acid, and acetonedicarboxylic acid; and bases such as ammonia, hydroxylamine, primary, secondary, and tertiary amines, quaternary ammonium, and polyamines. Preferable among such salts is a salt formed from at least one acid selected from the group consisting of pyruvic acid and levulinic acid; and at least one base selected from the group consisting of ammonia, methylamine, ethylamine, propylamine, butylamine, dimethylamine, diethylamine, trimethylamine, triethylamine, propanediamine, triethylenetetramine, tetramethylammonium hydroxide, and choline. A more preferable salt is a diethylamine, tetramethylammonium hydroxide, or choline salt of pyruvic acid, or a methylamine, ethylamine, diethylamine, tetramethylammonium hydroxide, or choline salt of levulinic acid.

Examples of aldehyde acid salts include salts formed from glyoxylic acid and bases such as ammonia, hydroxylamine, primary, secondary, and tertiary amines, quaternary ammonium, and polyamines. Preferable among such salts is a butylamine, diethylamine, tetramethylammonium hydroxide, or choline salt of glyoxylic acid.

The keto acid salt or aldehyde acid salt may be in the form of crystals, or in the form of an aqueous solution obtained by mixing each acid and a base in water, and neutralizing the mixture.

The concentration of the at least one component selected from the group consisting of a keto acid, a keto acid salt, and an aldehyde acid salt in the residue-removing solution can be suitably selected according to the amount or nature of the residues after a dry process to be removed. The concentration of the at least one component selected from the group consisting of a keto acid, a keto acid salt, and an aldehyde acid salt may typically be from about 0.1 to about 35% by weight.

More specifically, the concentration of the keto acid in the residue-removing solution may typically be from 0.5 to 10% by weight, preferably from 1 to 5% by weight, and more preferably from 1 to 3% by weight. The lower the concentration of the keto acid, the smaller the residue-removing effect; the higher the concentration, the greater the residue-removing effect and the longer the lifetime of the chemical solution. The concentration of the keto acid, however, is preferably 10% by weight or less, in consideration of cost-effectiveness and the tendency of an acid to cause cracking on the Cu surface.

The concentration of the aldehyde acid salt and/or the keto acid salt in the residue-removing solution may typically be from 0.1 to 35% by weight, preferably from 0.3 to 15% by weight, and more preferably from 0.5 to 10% by weight. The lower the concentration of these acids, the smaller the residue-removing effect; the effect is particularly small when the concentration is less than 0.1% by weight. The higher the concentration, the greater the effect of removal and the longer the lifetime of the chemical solution; however, the concentration is preferably 35% by weight or less, in consideration of the cost-effectiveness.

Addition of a polycarboxylic acid salt to the residue-removing solution can enhance the effect of preventing Cu surface cracking and the effect of removing the residues after a dry process. An amine salt of a polycarboxylic acid, in particular, exhibits a significant effect of preventing Cu surface cracking. Examples of such polycarboxylic acid salts include salts formed from polycarboxylic acids such as oxalic acid, malonic acid, succinic acid, glutaric acid, malic acid, tartaric acid, diammonium hydrogen citrate, ammonium dihydrogen citrate, and citric acid; and bases such as ammonia, hydroxylamine, primary, secondary, and tertiary amines, quaternary ammonium, and polyamines. Examples of preferable salts are those formed from polycarboxylic acids such as malonic acid, diammonium hydrogen citrate, ammonium dihydrogen citrate, and citric acid; and bases such as ammonia, primary, secondary, and tertiary amines, quaternary ammonium, and polyamines.

Specific examples of such salts are ammonium, methylamine, ethylamine, propylamine, butylamine, dimethylamine, diethylamine, trimethylamine, triethylamine, propanediamine, triethylenetetramine, tetramethylammonium hydroxide, choline, and like salts of polycarboxylic acids such as malonic acid, diammonium hydrogen citrate, ammonium dihydrogen citrate, and citric acid.

Most preferable of these salts are ammonium, methylamine, ethylamine, tetramethylammonium hydroxide, and choline salts of malonic acid; methylamine, ethylamine, tetramethylammonium hydroxide, and choline salts of diammonium hydrogen citrate; methylamine, ethylamine, tetramethylammonium hydroxide, and choline salts of ammonium dihydrogen citrate; and ammonium, methylamine, ethylamine, tetramethylammonium hydroxide, and choline salts of citric acid.

When used, these polycarboxylic acid salts may be in the form of crystals, or in the form of aqueous solutions obtained by mixing these acids and bases in water, and neutralizing the mixtures. The concentration of the polycarboxylic acid salt in the residue-removing solution is typically from 0.1 to 15% by weight, preferably from 0.5 to 10% by weight, and more preferably from 0.75 to 8% by weight. The lower the concentration of these salts, the smaller the residue-removing effect; the effect is particularly small when the concentration is less than 0.1% by weight. The higher the concentration, the greater the effect of removal and the longer the lifetime of the chemical solution; however, the concentration is preferably 10% by weight or less, in consideration of the cost-effectiveness.

The residue-removing solution may further contain a fluorine compound and/or a neutral organic compound containing an oxygen atom that can coordinate to Cu. This increases the removing effect for residues adhering to the side walls of the pattern made of an interlayer dielectric such as a low-k film. These residues include, in addition to Cu degradation products, residues of the stopper film such as SiN, low-k film, filling material, and the like sputtered by dry etching, and may contain Si and organic substances. Even if the residues include Si and organic substances, however, when Cu oxide is the principal constituent, the residues can be usually removed without adding a fluorine compound. Moreover, an interlayer dielectric such as a low-k film that has been plasma-damaged in a dry process is easily etched with a fluorine compound, sometimes preventing the substrate from being processed to the dimensions as designed. For this reason, when the residues cannot be sufficiently removed, or when it is unclear whether the residues have been removed or not, a small amount of a fluorine compound is preferably added to impart a greater effect of removal.

Examples of fluorine compounds include hydrogen fluoride, and fluoride salts of ammonia, hydroxylamine, primary, secondary, and tertiary amines, quaternary ammonium, polyamines, and the like. More specifically, preferable examples include hydrogen fluoride, ammonium fluoride, ammonium hydrogen difluoride, methylamine fluoride, ethylamine fluoride, diethylamine fluoride, triethylenetetramine fluoride, tetramethylammonium fluoride, and the like. One or more of such fluorine compounds may be used. In one embodiment of the invention, aqueous ammonium fluoride solution, methylamine fluoride, tetramethylammonium fluoride, and diluted fluoric acid (50 wt % aqueous solution) can be used advantageously.

The concentration of the fluorine compound in the residue-removing solution can be suitably selected according to the types and amounts of the interlayer dielectric such as a silicon-containing film or a low-k film and the interlayer dielectric that has been plasma-damaged in a dry process. The concentration of the fluorine compound is 5% by weight or less, preferably from 0.001 to 5% by weight, and more preferably from 0.01 to 3% by weight.

When it is necessary to prevent the plasma-damaged portion of the interlayer dielectric from being etched with the residue-removing solution of the invention, a fluorine compound is preferably not added, or only a small amount (1% by weight or less) of a fluorine compound is preferably added. If, however, the amount of the fluorine compound is less than 0.001% by weight, the residue-removing effect may decrease.

When a neutral organic compound containing an oxygen atom that can coordinate to Cu is added to the residue-removing solution of the invention, the degree of dissociation of the fluorine compound decreases; thus, a large amount of fluorine compound is preferably added to impart an effect equal to that obtained only with an aqueous solution not containing the neutral organic compound. If, however, the amount of fluorine compound exceeds 5% by weight, the plasma-damaged portion of the interlayer dielectric may be etched, preventing the substrate from being processed to the dimensions as designed.

The neutral organic compound containing an oxygen atom that can coordinate to Cu is preferably a neutral organic solvent with two or more oxygen atoms, or an oxygen atom-containing neutral organic solvent with a hydrophobic group such as a long-chain alkyl group or the like. These organic solvents enhance the removing effect for residues adhering to the side walls of the pattern made of an interlayer dielectric such as a low-k film and residues on the surface of the interlayer dielectric substrate, and impart the effect of preventing Cu corrosion. The term "neutral organic solvent" denotes solvents other than protogenic solvents (acidic solvents) and protophilic solvents (basic solvents).

Examples of such neutral organic compounds include polycarbonyls; hydroxy ketones; esters such as carbonates, cyclic esters, keto acid esters, oxyesters, and alkoxy esters;

alcohols such as monohydric alcohols, polyhydric alcohols, and alkoxy alcohols; polyethers; and the like.

Examples of polycarbonyls include 2,3-butanedione, 2,4-pentadione, methylglyoxal, and the like. 2,3-Butanedione and 2,4-pentadione are preferred.

Examples of hydroxy ketones include acetoin, acetone alcohol, diacetone alcohol, and the like. Acetoin and acetone alcohol are preferred.

Examples of esters include carbonates such as dimethyl carbonate and diethyl carbonate; cyclic esters such as propylene carbonate, ethylene carbonate, and γ-butyrolactone; keto acid esters such as methyl acetoacetate and ethyl acetoacetate; oxyesters such as methyl lactate, ethyl lactate, and butyl lactate; alkoxy esters such as ethylene glycol monomethyl ether acetate, ethylene glycol monoethyl ether acetate, ethylene glycol mono-n-butyl ether acetate, diethylene glycol monomethyl ether acetate, diethylene glycol monoethyl ether acetate, diethylene glycol mono-n-butyl ether acetate, ethylene glycol diacetate (ethylene diacetate), propylene glycol monomethyl ether acetate (PGMEA), and propylene glycol monoethyl ether acetate.

Preferable among the above-mentioned esters are propylene carbonate, γ-butyrolactone, ethylene diacetate, PGMEA, methyl acetoacetate, ethyl acetoacetate, ethyl lactate, and the like.

Examples of alcohols include monohydric alcohols with long-chain (e.g., C3-C6) alkyl groups or like hydrophobic groups, such as isopropyl alcohol, 1-butanol, tert-butyl alcohol, and isobutyl alcohol; polyhydric alcohols such as ethylene glycol, diethylene glycol, triethylene glycol, tetraethylene glycol, polyethylene glycol, propylene glycol, dipropylene glycol, poly(propylene glycol), glycerol, 2-amino-2-ethyl-1,3-propanediol, 2-amino-2-methyl-1,3-propanediol, 1,2-cyclohexanediol, 2,2-dimethyl-1,3-propanediol, 2,5-dimethyl-2,5-hexanediol, 2,3-naphthalenediol, 1,2-butanediol, 1,3-butanediol, 1,4-butanediol, 2-butyne-1,4-diol, 2-butene-1,4-diol, 1,3-propanediol, 1,2-propanediol, DL-1,2-hexanediol, 2,5-hexanediol, 1,2-benzenediol, 2,4-pentanediol, and 2-methyl-2,4-pentanediol; alkoxy alcohols such as ethylene glycol monomethyl ether, ethylene glycol monoethyl ether, ethylene glycol mono-n-butyl ether, ethylene glycol monophenyl ether, diethylene glycol monomethyl ether, diethylene glycol monoethyl ether, diethylene glycol monoisobutyl ether, diethylene glycol mono-n-butyl ether, diethylene glycol monobenzyl ether, diethylene glycol monohexyl ether, diethylene glycol monobenzyl ether, triethylene glycol monomethyl ether, triethylene glycol monobutyl ether, tripropylene glycol monomethyl ether, tetraethylene glycol monomethyl ether, tetraethylene glycol mono-n-dodecyl ether, heptaethylene glycol mono-n-dodecyl ether, and polyethylene glycol monomethyl ether.

Preferable among the above-mentioned alcohols are isopropyl alcohol, 1-butanol, isobutyl alcohol, diethylene glycol, dipropylene glycol, triethylene glycol, tetraethylene glycol, and the like.

Examples of polyethers include dimethoxymethane, diethoxymethane, dimethoxyethane, dimethoxypropane, ethylene glycol dimethyl ether, ethylene glycol methyl ethyl ether, ethylene glycol diethyl ether, ethylene glycol di-n-butyl ether, diethylene glycol dimethyl ether, diethylene glycol methyl ethyl ether, diethylene glycol diethyl ether, diethylene glycol di-n-butyl ether, triethylene glycol dimethyl ether, triethylene glycol ethylmethyl ether, triethylene glycol diethyl ether, tetraethylene glycol dimethyl ether, tetraethylene glycol diethyl ether, polyethylene glycol dimethyl ether, and the like.

Preferable among the above-mentioned polyethers are ethylene glycol dimethyl ether, diethylene glycol dimethyl ether, diethylene glycol diethyl ether, triethylene glycol dimethyl ether, tetraethylene glycol dimethyl ether, and the like.

Among the above-mentioned neutral organic compounds, preferable compounds are 2,3-butanedione, 2,4-pentadione, acetylacetone, acetoin, propylene carbonate, γ-butyrolactone, ethylene glycol mono-n-butyl ether acetate, diethylene glycol monoethyl ether acetate, diethylene glycol mono-n-butyl ether acetate, ethylene glycol diacetate (ethylene diacetate), propylene glycol monomethyl ether acetate (PGMEA), isopropyl alcohol, 1-butanol, tert-butyl alcohol, isobutyl alcohol, diethylene glycol, dipropylene glycol, triethylene glycol, tetraethylene glycol, glycerol, 2,2-dimethyl-1,3-propanediol, 1,3-propanediol, 2-methyl-2,4-pentanediol, ethylene glycol mono-n-butyl ether, ethylene glycol monophenyl ether, diethylene glycol monomethyl ether, diethylene glycol monoethyl ether, diethylene glycol mono-n-butyl ether, triethylene glycol monomethyl ether, triethylene glycol monobutyl ether, tripropylene glycol monomethyl ether, dimethoxymethane, ethylene glycol dimethyl ether, diethylene glycol dimethyl ether, diethylene glycol diethyl ether, triethylene glycol dimethyl ether, tetraethylene glycol dimethyl ether, methyl acetoacetate, ethyl acetoacetate, ethyl lactate, and the like.

More preferable compounds are 2,3-butanedione, 2,4-pentadione, acetoin, propylene carbonate, γ-butyrolactone, diethylene glycol monoethyl ether acetate, ethylene glycol diacetate (ethylene diacetate), propylene glycol monomethyl ether acetate (PGMEA), isopropyl alcohol, 1-butanol, isobutyl alcohol, diethylene glycol, dipropylene glycol, triethylene glycol, tetraethylene glycol, ethylene glycol dimethyl ether, diethylene glycol dimethyl ether, diethylene glycol diethyl ether, triethylene glycol dimethyl ether, tetraethylene glycol dimethyl ether, methyl acetoacetate, ethyl acetoacetate, ethyl lactate, and the like.

Particularly preferable compounds are 2,3-butanedione, acetoin, propylene carbonate, diethylene glycol monoethyl ether acetate, ethylene glycol diacetate (ethylene diacetate), propylene glycol monomethyl ether acetate (PGMEA), isopropyl alcohol, diethylene glycol, triethylene glycol, tetraethylene glycol, ethylene glycol dimethyl ether, diethylene glycol dimethyl ether, triethylene glycol dimethyl ether, methyl acetoacetate, ethyl acetoacetate, and ethyl lactate.

The concentration of the neutral organic compound containing an oxygen atom that can coordinate to Cu in the residue-removing solution is typically from 0.1 to 60% by weight, and preferably from 2 to 40% by weight.

The residue-removing solution of the invention may further contain a surfactant. Such a surfactant is added to increase the wettability of the hydrophobic interlayer dielectric, and distribute the chemical solution uniformly according to the shape of the pattern. The surfactant is not limited, and may be a cationic, anionic, nonionic, or a like surfactant. The concentration of the surfactant in the residue-removing solution is typically from 0.00001 to 5% by weight, and preferably from 0.0001 to 3% by weight. If the concentration is less than 0.00001% by weight, the effect of surface activation is small; however, even if the concentration exceeds 5% by weight, the effect does not change.

The residue-removing solution of the invention may further contain a crack inhibitor. Examples of the crack inhibitor include sulfur-containing compounds with unpaired electrons, which contain oxygen with unpaired electrons and/or nitrogen with unpaired electrons; such an example is at least one sulfur-containing compound selected from the group consisting of sulfides, mercaptans, thiocarboxylic acids, thioacetamides, thioureas, thiadiazoles, tetrazoles, triazines, thiazoles, thiophenes, pyrimidines, purines, thiazolines, and thiazolidins. More specifically, examples of preferable compounds are as follows.

Examples of sulfides include thiodiglycol, 2,2'-thiodiacetic acid, 3,3'-dithiodipropionic acid, and the like.

Examples of mercaptans include mercaptoacetic acid, thiomalic acid, thiolactic acid, 3-mercaptopropionic acid, aminothiophenol, 2-mercaptoethanol, 3-mercapto-1,2-propanediol, and the like.

Examples of thiocarboxylic acids include thiolacetic acid, 3-acetylthio-2-methylpropanoic acid, and the like.

Examples of thioacetamides include thioacetamide and the like.

Examples of thioureas include thiourea, thiocarbohydrazide, guanyl thiourea, ethylene thiourea, malonyl thiourea, and the like.

Examples of thiadiazoles include 2,5-dimercapto-1,3,4-thiadiazole, (5-mercapto-1,3,4-thiadiazole-2-ylthio)acetic acid, 1,3,4-thiadiazole-2,5-dithioacetic acid, and the like.

Examples of tetrazoles include 1-methyl-5-mercapto-1H-tetrazole and the like.

Examples of triazines include 2,4,6-trimercapto-S-triazine and the like.

Examples of thiazoles include 4-thiazolecarboxylic acid, 2-aminothiazole, and the like.

Examples of thiophenes include 2,5-thiophenedicarboxylic acid, 3-thiophenemalonic acid, 2-thiophenecarboxylic acid, and the like.

Examples of pyrimidines include 2-thiobarbituric acid, 2-thiocytosine, thiouracil, 4-amino-6-hydroxy-2-mercaptopyrimidine, and the like.

Examples of purines include 2,5-dithiopurine, 6-mercaptopurine, and the like.

Examples of thiazolines include 2-amino-2-thiazoline, 2-thiazoline-2-thiol, and the like.

Examples of thiazolidins include 2,4-thiazolidinedione, 2-thio-4-thiazolidone, 2-imino-4-thiazolidinone, and the like.

Most preferable among these are 2-amino-2-thiazoline, mercaptoacetic acid, 3-mercaptopropionic acid, thiolactic acid, and thiomalic acid.

In the invention, a crack inhibitor can be used additionally when the keto acid is used alone, or when the acidity is high. The concentration of the crack inhibitor is from 0.00001 to 3% by weight, and preferably from 0.0005 to 1% by weight.

The residue-removing solution of the invention may further contain an antioxidant. Examples of antioxidants include benzotriazole and the like. The concentration of the antioxidant is, for example, from 0.00001 to 3% by weight, and preferably from 0.0005 to 1% by weight.

The proportion of water incorporated in the residue-removing solution of the invention is typically from about 40 to about 99.5% by weight, and preferably from about 60 to about 99% by weight; the proportion can be determined according to the proportions (the concentrations) of components other than water.

The pH of the residue-removing solution of the invention is from 2 to 9. A pH of less than 2 will easily cause Cu corrosion, whereas a pH of more than 9 tends to damage the low-k film. The pH is preferably from 4 to 7. The pH is adjusted according to the amounts of the aldehyde acid and/or keto acid and the base(s) during the preparation of salt(s).

For example, in the case of a residue-removing solution containing water and at least one component selected from the group consisting of (a) a keto acid, (b) a keto acid salt, and (c) an aldehyde acid salt, the concentration of the at least one component selected from the group consisting of a keto acid, a keto acid salt, and an aldehyde acid salt is from about 0.1 to about 35% by weight (preferably from about 0.5 to about 20% by weight), and the pH is from about 2 to about 8 (preferably from about 4 to about 7).

In the case of a residue-removing solution containing water, at least one component selected from the group consisting of (a) a keto acid, (b) a keto acid salt, and (c) an aldehyde acid salt, and a neutral organic compound containing an oxygen atom that can coordinate to Cu oxide, the concentration of the at least one component selected from the group consisting of a keto acid, a keto acid salt, and an aldehyde acid salt is from about 0.5 to about 20% by weight (preferably from about 1 to about 10% by weight), the concentration of the neutral organic compound is from about 0.1 to about 60% by weight (preferably from about 2 to about 40% by weight), and the pH is from about 2 to about 8 (preferably from about 4 to about 7).

In the case of a residue-removing solution containing water, at least one component selected from the group consisting of (a) a keto acid, (b) a keto acid salt, and (c) an aldehyde acid salt, and a polycarboxylic acid salt, the concentration of the at least one component selected from the group consisting of a keto acid, a keto acid salt, and an aldehyde acid salt is from about 0.1 to about 10% by weight (preferably from about 0.5 to about 5% by weight), the concentration of the polycarboxylic acid salt is from about 0.1 to about 10% by weight (preferably from about 0.5 to about 8% by weight), and the pH is from about 4 to about 6 (preferably from about 5 to about 6).

In the case of a residue-removing solution containing water, at least one component selected from the group consisting of (a) a keto acid, (b) a keto acid salt, and (c) an aldehyde acid salt, a polycarboxylic acid salt, and a neutral organic compound containing an oxygen atom that can coordinate to Cu oxide, the concentration of the at least one component selected from the group consisting of a keto acid, a keto acid salt, and an aldehyde acid salt is from about 0.1 to about 10% by weight (preferably from about 0.5 to about 5% by weight), the concentration of the polycarboxylic acid salt is from about 0.1 to about 10% by weight (preferably from about 0.5 to about 8% by weight), the concentration of the neutral organic compound is from about 0.1 to about 60% by weight (preferably from about 2 to about 40% by weight), and the pH is from about 4 to about 6 (preferably from about 5 to about 6).

Removal of Cu Oxide and/or Residues after a Dry Process

The method for removing residues of the invention is a method for removing residues present on semiconductor substrates after a dry process (dry etching and/or ashing), typically in the formation processes of damascene, dual damascene, and like structures, as well as capacitor structures. More specifically, the method removes the residues present on semiconductor substrates with a Cu/low-k multilayer interconnect structure after a dry process, using the above-described residue-removing solution.

The invention also provides a method for manufacturing semiconductor devices. The method includes the steps of (1) subjecting a semiconductor substrate having Cu as an interconnect material, and a low dielectric constant film (a low-k film) as an interlayer dielectric material, to dry etching and/or ashing; and (2) bringing the semiconductor substrate processed in Step (1) into contact with the residue-removing solution.

After the formation of a low-k film on a substrate, an insulating film barrier such as a SiN, SiC, TaN, or like film may be formed, as needed, on the low-k film, and etched together with the low-k film.

The process of removing residues is performed by bringing target semiconductor substrates into contact with the residue-removing solution. The method for bringing the substrates into contact with the residue-removing solution can be determined according to the type or temperature of the residue-removing solution. Various contact methods can be used; such as, for example, a batch method wherein a large number of targets (wafers) housed in cassettes are immersed in a tank containing the chemical solution; a single-wafer method wherein cleaning is performed by applying the chemical solution onto the targets (wafers) that are being rotated; and a spraying method wherein cleaning is performed by continuously spraying the chemical solution toward the targets (wafers).

The temperature of the residue-removing solution is, for example, from about 10 to about 60° C., and preferably from about 15 to about 40° C. The contact time is not limited, and may be suitably selected; for example, the contact time is from about 0.5 to about 60 minutes, and preferably from about 1 to about 40 minutes.

In the batch method, wafers may be immersed, as required, in the residue-removing solution that is being stirred. The stirring speed is not limited, and may be suitably selected. When unwanted substances are difficult to remove, the targets may be immersed in the residue-removing solution and subjected to, for example, ultrasonic cleaning.

The method for removing Cu oxide of the invention may further include cleaning, with pure water, the wafers from which Cu oxide and/or residues after a dry process have been removed. This cleaning step allows the residue-removing solution of the invention to be rinsed off.

Semiconductor substrates from which Cu oxide and/or residues after a dry process have been removed using the residue-removing solution of the invention can be processed into various types of semiconductor devices, using known processes such as, for example, the formation of Cu interconnects (for example, the process described in *Details of Semiconductor CMP Technology*; written and edited by Toshiro DOI, 2001).

Effects of the Invention

The residue-removing solution of the invention is capable of preventing silicon-containing films and low-k films from being etched; removing residues after a dry process and Cu oxide films without causing Cu corrosion; and preventing minute cracks on a Cu surface, which has heretofore been unresolved with known polymer-removing solutions.

BEST MODE FOR CARRYING OUT THE INVENTION

Features of the present invention will be clarified with reference to the following Examples; however, the invention is not limited by these Examples.

In order to examine the removal of residues after a dry process and changes in the pattern shapes, wafers having test patterns with a Cu/low-k dual damascene structure formed by the via-first process were used. The low-k film of the Cu/low-k dual damascene structure was a SiOC film formed by plasma CVD, and the insulating film barrier was a SiN film. Residues after a dry process were present in large amounts at the bottoms of via holes, and observed in small amounts on the side walls of the via holes and on the surface of the low-k substrate.

The process of removing residues after a dry process was performed as follows. The wafers with test patterns were immersed in the chemical solutions at 25° C. shown in the Examples and Comparative Examples, while being stirred (at about 600 rpm) for 1 to 3 minutes. The immersed wafers were then rinsed under running ultrapure water and dried.

After the residue-removal process, 12 via holes were examined with an electron microscope (SEM) for their cross-sectional shape and the state of their residue-removal after a dry process. Moreover, in order to determine the presence or absence of cracks on the Cu surface, 60 via holes were examined under an electron microscope (SEM). Where necessary, a cross-section of the via holes was examined under an SEM.

Furthermore, in order to examine damage to the Cu and low-k films, which is difficult to detect in evaluations using the wafers with test patterns, blanket wafers having these films thereon were immersed in the chemical solutions of the Examples and Comparative Examples for 10 minutes, after which the etching rates were determined. In order to examine changes in their surface conditions, the low-k films were measured for their contact angles before and after immersion in the chemical solutions, and the contact angles were compared. According to thermal desorption spectroscopy (TDS), there is a correlation that the greater the change in contact angle, the greater the amount of water adsorption. That is to say, the change in contact angle reflects the change in the outermost surface of the low-k film. The contact angle was measured using a contact angle meter.

Tables 2 and 4 show the Examples, and Table 6 shows the Comparative Examples. Tables 3, 5, and 7 show the results of the tests using the chemical solutions shown in Tables 2, 4, and 6, respectively. Table 1 presents the determination criteria for the test results.

TABLE 1

| | | Evaluations Using the Patterned Wafers | | | | | | | Evaluations Using the Blanket Films | | |
|---|---|---|---|---|---|---|---|---|---|---|---|
| | | Residue-Removing Performance | | | Evaluation of Via Hole Pattern Shapes (Immersion Time in the Chemical Solutions: 3 min) | | | | | | |
| | | Via Holes | | | | | | | Low-k Film (SiOC Film) | | |
| | | Cu Surface | Side Walls | Substrate Surface | Cu Surface | Side Walls | Cu Surface Cracking (*) | Cu Corrosion | Etching | | Surface Layer Degradation | |
| Criteria Determination | | Residue Removal Time | | | Surface Condition | | | Etching (Corrosion) Rate | | Change in Contact Angle | | |
| | Best | A: | 1 min or less | | A: no erosion | | A: no cracks | A: | 1 Å/ min or less | | A: | 1° or less |
| | Good | B: | 1-2 min | | B: no erosion problems | | B: 3 or less shallow cracks | B: | 1-2 Å/ min | | B: | 1-3° |

TABLE 1-continued

| | Evaluations Using the Patterned Wafers | | | | | | | Evaluations Using the Blanket Films | | | |
|---|---|---|---|---|---|---|---|---|---|---|---|
| | Residue-Removing Performance | | | Evaluation of Via Hole Pattern Shapes (Immersion Time in the Chemical Solutions: 3 min) | | | | Low-k Film (SiOC Film) | | | |
| | Via Holes | | | | | | | | | | |
| | Cu Surface | Side Walls | Substrate Surface | Cu Surface | Side Walls | Cu Surface Cracking (*) | Cu Corrosion | Etching | | Surface Layer Degradation | |
| Partly Defective | C: | 2-3 min | | C: | a low degree of surface roughness | C: | 5 or less normal cracks | C: | 2-3 Å/ min | C: | 3-5° |
| Defective | D: | 3 min or more | | D: | erosion | D: | 5 or more deep cracks | D: | 3 Å/ min or more | D: | 5° or more |

(*) The term "shallow cracks" denotes cracks with a width and a depth of less than about 10 nm; the term "deep cracks" denotes cracks with a width and a depth of more than about 20 nm; and the term "normal cracks" denotes cracks with a width and a depth of from about 10 to about 20 nm.

Examples 1 to 29

The residue-removing solutions of Examples 1 to 29 listed in Table 2 were adjusted to a pH of around 6.5.

As shown in Examples 23 to 29, when the residues on Cu surfaces are difficult to remove only with an aldehyde acid salt or a keto acid salt, the residue-removing effect can be enhanced by adding a neutral organic compound containing an oxygen atom that can coordinate to Cu (hereinafter referred to as a "neutral organic compound") and $NH_4F$. Moreover, when the residues on the side walls of the pattern are difficult to remove, the residue-removal effect can be increased by adding $NH_4F$; and when the residues on the substrate surface are difficult to remove, the residue-removal effect can be increased by adding a neutral organic compound.

TABLE 2

| | | Composition of Residue-Removing Solution | | | | | | |
|---|---|---|---|---|---|---|---|---|
| | | Composition of Aldehyde Acid Salt or Keto Acid Salt | | | | | Neutral Organic | |
| Ex. | Water (% by Weight) | Aldehyde Acid or Keto Acid (% by weight) | | Base (% by weight) | | $NH_4F$ (% by weight) | Compound (% by weight) | |
| 1 | 98.5 | Glyoxylic Acid | 1.2 | Ammonia | 0.3 | 0 | — | — |
| 2 | 98.2 | Glyoxylic Acid | 1.2 | Methylamine | 0.5 | 0 | — | — |
| 3 | 98.0 | Glyoxylic Acid | 1.2 | Ethylamine | 0.8 | 0 | — | — |
| 4 | 97.5 | Glyoxylic Acid | 1.2 | Butylamine | 1.2 | 0 | — | — |
| 5 | 97.5 | Glyoxylic Acid | 1.2 | Diethylamine | 1.2 | 0 | — | — |
| 6 | 97.2 | Glyoxylic Acid | 1.2 | Tetramethyl-ammonium Hydroxide | 1.5 | 0 | — | — |
| 7 | 96.7 | Glyoxylic Acid | 1.2 | Choline | 2.0 | 0 | — | — |
| 8 | 97.8 | Pyruvic Acid | 1.5 | Ethylamine | 0.8 | 0 | — | — |
| 9 | 97.3 | Pyruvic Acid | 1.5 | Butylamine | 1.2 | 0 | — | — |
| 10 | 97.3 | Pyruvic Acid | 1.5 | Diethylamine | 1.2 | 0 | — | — |
| 11 | 97.0 | Pyruvic Acid | 1.5 | Tetramethyl-ammonium Hydroxide | 1.5 | 0 | — | — |
| 12 | 96.5 | Pyruvic Acid | 1.5 | Choline | 2.0 | 0 | — | — |
| 13 | 97.3 | Levulinic Acid | 1.9 | Ethylamine | 0.8 | 0 | — | — |
| 14 | 96.8 | Levulinic Acid | 1.9 | Butylamine | 1.2 | 0 | — | — |
| 15 | 96.8 | Levulinic Acid | 1.9 | Diethylamine | 1.2 | 0 | — | — |
| 16 | 96.5 | Levulinic Acid | 1.9 | Tetramethyl-ammonium Hydroxide | 1.5 | 0 | — | — |
| 17 | 96.0 | Levulinic Acid | 1.9 | Choline | 2.0 | | — | — |
| 18 | 96.1 | α-Ketoglutaric Acid | 2.4 | Ethylamine | 1.5 | 0 | — | — |
| 19 | 95.1 | α-Ketoglutaric Acid | 2.4 | Butylamine | 2.4 | 0 | — | — |
| 20 | 96.3 | α-Ketoglutaric Acid | 2.4 | Butylamine | 1.2 | 0 | — | — |
| 21 | 94.5 | α-Ketoglutaric Acid | 2.4 | Tetramethyl-ammonium Hydroxide | 3.0 | 0 | — | — |
| 22 | 93.5 | α-Ketoglutaric Acid | 2.4 | Choline | 4.0 | 0 | — | — |
| 23 | 77.3 | Levulinic Acid | 1.9 | Ammonia | 0.3 | 0.5 | 2,3-Butanedione | 20 |
| 24 | 57.0 | Levulinic Acid | 1.9 | Methylamine | 0.5 | 0.5 | Ethyl Lactate | 40 |
| 25 | 81.8 | Levulinic Acid | 1.9 | Ethylamine | 0.8 | 0.5 | Propylene Carbonate | 15 |

TABLE 2-continued

| | | Composition of Residue-Removing Solution | | | | | | |
|---|---|---|---|---|---|---|---|---|
| | | Composition of Aldehyde Acid Salt or Keto Acid Salt | | | | | Neutral Organic | |
| Ex. | Water (% by Weight) | Aldehyde Acid or Keto Acid (% by weight) | | Base (% by weight) | | NH₄F (% by weight) | Compound (% by weight) | |
| 26 | 56.3 | Levulinic Acid | 1.9 | Butylamine | 1.2 | 0.5 | Triethylene Glycol | 40 |
| 27 | 56.3 | Levulinic Acid | 1.9 | Diethylamine | 1.2 | 0.5 | Isopropyl Alcohol | 40 |
| 28 | 56.0 | Levulinic Acid | 1.9 | Tetramethyl-ammonium Hydroxide | 1.5 | 0.5 | Propylene Glycol Monomethyl Ether Acetate | 40 |
| 29 | 90.5 | Levulinic Acid | 1.9 | Choline | 2.0 | 0.5 | 1-Butanol | 5 |

Table 3 shows the results of the tests using the chemical solutions of Examples 1 to 29.

From the results of the evaluations using the wafers with test patterns shown in Table 3, it is clear that the residue-removing solutions of Examples 1 to 29 exhibit excellent residue-removing performance: they caused neither a change in the pattern shapes nor minute cracks on the Cu surfaces. The results of the evaluations using the blanket wafers show that the residue-removing solutions cause neither Cu corrosion nor damage to low-k films, because the etching rates for Cu and low-k films were low, and the contact angles of the low-k films also did not change.

In Examples 1 to 29, similar effects are attained when a dimethylamine, trimethylamine, or like salt is used as an aldehyde acid or keto acid salt.

In Example 13, similar effects were attained when a methylamine salt was used as a levulinic acid salt.

In Examples 13 to 17, similar effects are attained when 5-aminolevulinic acid is used instead of a levulinic acid salt.

In Example 27, similar effects were attained when pyruvic acid was used instead of levulinic acid; and acetoin, ethylene glycol diacetate (ethylene diacetate), diethylene glycol monoethyl ether acetate (2-(2-ethoxyethoxy)ethyl acetate), diethylene glycol, triethylene glycol dimethyl ether, or methyl acetoacetate was used as a neutral organic compound.

In Examples 23 to 26, 28, and 29, similar effects are attained when 5-aminolevulinic acid, pyruvic acid, or α-ketoglutaric acid is used instead of levulinic acid; and acetoin, ethylene glycol diacetate (ethylene diacetate), diethylene glycol monoethyl ether acetate (2-(2-ethoxyethoxy)ethyl acetate), diethylene glycol, triethylene glycol dimethyl ether, or methyl acetoacetate is used as a neutral organic compound.

In Examples 1 to 29, increasing the concentrations of the residue-removing solutions enhances the effects obtained; however, even when the concentrations are reduced to half, the solutions exhibit sufficient effects.

TABLE 3

| | Evaluations Using the Patterned Wafers | | | | | | Evaluations Using the Blanket Films | | |
|---|---|---|---|---|---|---|---|---|---|
| | Residue-Removing Performance | | | Evaluation of Via Hole Pattern Shapes (Immersion Time in the Chemical Solutions: 3 min) | | | | Low-k Film (SiOC Film) | |
| | Cu Surface | | | | | | Cu | Surface Layer Degradation | |
| Ex. | on Via Hole Bottom | Via Hole Side Walls | Substrate Surface | Cu Surface | Cu Surface Cracking | Side Walls | Corrosion Etching Rate | Etching | Change in Contact Angle |
| 1 | A | A | A | A | A | A | B | A | A |
| 2 | A | A | A | A | A | A | B | A | A |
| 3 | A | A | A | A | A | A | B | A | A |
| 4 | A | A | A | A | A | A | B | A | A |
| 5 | A | A | A | A | A | A | A | A | A |
| 6 | A | A | A | A | A | A | A | A | A |
| 7 | A | A | A | A | A | A | A | A | A |
| 8 | A | A | A | A | A | A | B | A | A |
| 9 | A | A | A | A | A | A | B | A | A |
| 10 | A | A | A | A | A | A | A | A | A |
| 11 | A | A | A | A | A | A | A | A | A |
| 12 | A | A | A | A | A | A | A | A | A |
| 13 | A | A | A | A | A | A | B | A | A |
| 14 | A | A | A | A | A | A | B | A | A |
| 15 | A | A | A | A | A | A | A | A | A |
| 16 | A | A | A | A | A | A | A | A | A |
| 17 | A | A | A | A | A | A | B | A | A |
| 18 | A | A | A | A | A | A | B | A | A |
| 19 | A | A | A | A | A | A | B | A | A |
| 20 | A | A | A | A | A | A | B | A | A |
| 21 | A | A | A | A | A | A | B | A | A |
| 22 | A | A | A | A | A | A | B | A | A |
| 23 | A | A | A | A | A | A | B | A | A |
| 24 | A | A | A | A | A | A | B | A | A |

TABLE 3-continued

| | Evaluations Using the Patterned Wafers | | | | | | Evaluations Using the Blanket Films | | |
|---|---|---|---|---|---|---|---|---|---|
| | Residue-Removing Performance | | | Evaluation of Via Hole Pattern Shapes (Immersion Time in the Chemical Solutions: 3 min) | | | Cu | | Low-k Film (SiOC Film) Surface Layer Degradation |
| | Cu Surface on Via Hole | Via Hole | Substrate | Cu | Cu Surface | Side | Corrosion Etching | Etching | Change in |
| Ex. | Bottom | Side Walls | Surface | Surface | Cracking | Walls | | Rate | Contact Angle |
| 25 | A | A | A | A | A | A | B | A | A |
| 26 | A | A | A | A | A | A | B | A | A |
| 27 | A | A | A | A | A | A | A | A | A |
| 28 | A | A | A | A | A | A | A | A | A |
| 29 | A | A | A | A | A | A | A | A | A |

Examples 30 to 55

Among the residue-removing solutions listed in Table 4, the solutions of Examples 30 to 35 were adjusted to a pH of about 3, the solutions of Examples 45 to 48 were adjusted to a pH of about 6, and the solutions of Examples 36 to 44 and Examples 49 to 55 were adjusted to a pH of about 5.

As shown in Examples 33 to 35 and Examples 53 to 55, when the residues on Cu surfaces are difficult to remove with only a keto acid or a keto acid salt and a polycarboxylic acid salt, the residue-removing effect can be enhanced by adding $NH_4F$ and a neutral organic compound. Moreover, when the residues on the side walls of the pattern are difficult to remove, the residue-removing effect can be increased by adding $NH_4F$; and when the residues on the substrate surface are difficult to remove, the residue-removing effect can be increased by adding a neutral organic compound.

TABLE 4

Composition of Residue-Removing Solution

| | | | | Composition of Polycarboxylic Acid Salt | | | | | | |
|---|---|---|---|---|---|---|---|---|---|---|
| Ex. | Water (% by weight) | Keto Acid | (% by weight) | Poly-carboxylic Acid | (% by weight) | Base | (% by weight) | $NH_4F$ (% by weight) | Neutral Organic Compound | (% by weight) |
| 30 | 98.5 | Pyruvic Acid | 1.5 | — | — | — | 0 | 0 | — | — |
| 31 | 98.1 | Levulinic Acid | 1.9 | — | — | — | 0 | 0 | — | — |
| 32 | 97.6 | α-Ketoglutaric Acid | 2.4 | — | — | — | 0 | 0 | — | — |
| 33 | 58.4 | Pyruvic Acid | 1.5 | — | — | — | 0 | 0.1 | Ethyl Lactate | 40 |
| 34 | 58.0 | Levulinic Acid | 1.9 | — | — | — | 0 | 0.1 | Propylene Glycol Monomethyl Ether Acetate | 40 |
| 35 | 57.5 | α-Ketoglutaric Acid | 2.4 | — | — | — | 0 | 0.1 | Triethylene Glycol | 40 |
| 36 | 98.7 | Pyruvic Acid | 0.8 | Malonic Acid | 1.5 | Ammonia | 0.5 | 0 | — | — |
| 37 | 97.1 | Pyruvic Acid | 0.8 | Malonic Acid | 1.5 | Diethylamine | 2.1 | 0 | — | — |
| 38 | 96.6 | Pyruvic Acid | 0.8 | Malonic Acid | 1.5 | Tetramethyl-ammonium Hydroxide | 2.6 | 0 | — | — |
| 39 | 98.5 | Levulinic Acid | 1.0 | Malonic Acid | 1.5 | Ammonia | 0.5 | 0 | — | — |
| 40 | 96.9 | Levulinic Acid | 1.0 | Malonic Acid | 1.5 | Diethylamine | 2.1 | 0 | — | — |
| 41 | 96.3 | Levulinic Acid | 1.0 | Malonic Acid | 1.5 | Tetramethyl-ammonium Hydroxide | 2.6 | 0 | — | — |
| 42 | 98.9 | α-Ketoglutaric Acid | 0.6 | Malonic Acid | 1.5 | Ammonia | 0.5 | 0 | — | — |
| 43 | 97.2 | α-Ketoglutaric Acid | 0.6 | Malonic Acid | 1.5 | Diethylamine | 2.1 | 0 | — | — |
| 44 | 96.7 | α-Ketoglutaric Acid | 0.6 | Malonic Acid | 1.5 | Tetramethyl-ammonium Hydroxide | 2.6 | 0 | — | — |
| 45 | 98.8 | Levulinic Acid | 0.1 | Malonic Acid | 0.8 | Diethylamine | 1.1 | 0 | — | — |
| 46 | 97.7 | Levulinic Acid | 0.1 | Malonic Acid | 1.5 | Diethylamine | 2.1 | 0 | — | — |
| 47 | 98.5 | Levulinic Acid | 0.1 | Malonic Acid | 0.8 | Tetramethyl-ammonium Hydroxide | 1.3 | 0 | — | — |
| 48 | 97.2 | Levulinic Acid | 0.1 | Malonic Acid | 1.5 | Tetramethyl-ammonium Hydroxide | 2.6 | 0 | — | — |
| 49 | 96.9 | Levulinic Acid | 1.0 | Succinic Acid | 1.7 | Diethylamine | 2.1 | 0 | — | — |

TABLE 4-continued

Composition of Residue-Removing Solution

Composition of Polycarboxylic Acid Salt

| Ex. | Water (% by weight) | Keto Acid | (% by weight) | Polycarboxylic Acid | (% by weight) | Base | (% by weight) | NH₄F (% by weight) | Neutral Organic Compound | (% by weight) |
|---|---|---|---|---|---|---|---|---|---|---|
| 50 | 96.3 | Levulinic Acid | 1.0 | Succinic Acid | 1.7 | Tetramethyl-ammonium Hydroxide | 2.6 | 0 | — | — |
| 51 | 96.9 | Levulinic Acid | 1.0 | Glutaric Acid | 1.9 | Diethylamine | 2.1 | 0 | — | — |
| 52 | 96.3 | Levulinic Acid | 1.0 | Glutaric Acid | 1.9 | Tetramethyl-ammonium Hydroxide | 2.6 | 0 | — | — |
| 53 | 78.4 | Levulinic acid | 1.0 | Malonic acid | 1.5 | Ammonia | 0.5 | 0.1 | 2,3-Butanedione | 20 |
| 54 | 56.8 | Levulinic acid | 1.0 | Malonic acid | 1.5 | Diethylamine | 2.1 | 0.1 | Ethyl Lactate | 40 |
| 55 | 56.2 | Levulinic acid | 1.0 | Malonic acid | 1.5 | Tetramethyl-ammonium Hydroxide | 2.6 | 0.1 | Propylene Glycol Monomethyl Ether Acetate | 40 |

Table 5 shows the results of the tests using the chemical solutions of Examples 30 to 55.

From the results of the evaluations using the wafers with test patterns shown in Table 5, it is clear that the residue-removing solutions of Examples 30 to 55 exhibit excellent residue-removing performance: they did not cause a change in the pattern shapes, and only caused few or no cracks on the Cu surfaces. The results of the evaluations using the blanket wafers show that the residue-removing solutions cause little or no Cu corrosion or damage to low-k films, because the etching rates for Cu and low-k films were low, and the changes in the contact angles of the low-k films were negligible.

In Examples 36 to 38, similar effects were attained when diammonium hydrogen citrate, ammonium dihydrogen citrate, a citrate, or a like salt was used instead of a malonate.

In Examples 39 to 48 and Examples 53 to 55, similar effects are attained when diammonium hydrogen citrate, ammonium dihydrogen citrate, a citrate, or a like salt is used instead of a malonate.

In Examples 36 to 55, similar effects are attained when a methylamine salt, ethylamine salt, butylamine salt, dimethylamine salt, trimethylamine salt, triethylenetetramine salt, or like salt is used as a polycarboxylic acid.

In Examples 49 to 55, similar effects are attained when glyoxylic acid, pyruvic acid, 5-aminolevulinic acid, or α-ketoglutaric acid is used instead of levulinic acid.

In Examples 30 to 55, increasing the concentrations of the residue-removing solutions enhances the effects obtained; however, even when the concentrations are reduced to half, the solutions exhibit sufficient effects.

TABLE 5

| | Evaluations Using the Patterned Wafers | | | | | | Evaluations Using the Blanket Films | | |
|---|---|---|---|---|---|---|---|---|---|
| | Residue-Removing Performance | | | Evaluation of Via Hole Pattern Shapes (Immersion Time in the Chemical Solutions: 3 min) | | | | Low-k Film (SiOC Film) | |
| | Cu Surface | | | | | | Cu | | Surface Layer Degradation |
| Ex. | on Via Hole Bottom | Via Hole Side Walls | Substrate Surface | Cu Surface | Cu Surface Cracking | Side Walls | Corrosion Etching Rate | Etching | Change in Contact Angle |
| 30 | A | A | A | A | B | A | B | A | B |
| 31 | A | A | A | A | B | A | B | A | B |
| 32 | A | A | A | A | B | A | B | A | B |
| 33 | A | A | A | A | B | A | B | A | B |
| 34 | A | A | A | A | B | A | B | A | B |
| 35 | A | A | A | A | B | A | B | A | B |
| 36 | A | A | A | A | A | A | B | A | A |
| 37 | A | A | A | A | A | A | B | A | A |
| 38 | A | A | A | A | A | A | B | A | A |
| 39 | A | A | A | A | A | A | B | A | A |
| 40 | A | A | A | A | A | A | B | A | A |
| 41 | A | A | A | A | A | A | B | A | A |
| 42 | A | A | A | A | A | A | B | A | A |
| 43 | A | A | A | A | A | A | B | A | A |
| 44 | A | A | A | A | A | A | B | A | A |
| 45 | A | A | A | A | A | A | B | A | A |
| 46 | A | A | A | A | A | A | B | A | A |

TABLE 5-continued

| | Evaluations Using the Patterned Wafers | | | | | | Evaluations Using the Blanket Films | | |
|---|---|---|---|---|---|---|---|---|---|
| | Residue-Removing Performance | | | Evaluation of Via Hole Pattern Shapes (Immersion Time in the Chemical Solutions: 3 min) | | | Low-k Film (SiOC Film) | | |
| | Cu Surface | | | | | | Cu | | Surface Layer Degradation |
| Ex. | on Via Hole Bottom | Via Hole Side Walls | Substrate Surface | Cu Surface | Cu Surface Cracking | Side Walls | Corrosion | Etching Rate | Change in Contact Angle |
| 47 | A | A | A | A | A | A | B | A | A |
| 48 | A | A | A | A | A | A | B | A | A |
| 49 | A | A | A | A | A | A | B | A | A |
| 50 | A | A | A | A | A | A | B | A | A |
| 51 | A | A | A | A | A | A | B | A | A |
| 52 | A | A | A | A | A | A | B | A | A |
| 53 | A | A | A | A | A | A | B | A | A |
| 54 | A | A | A | A | A | A | B | A | A |
| 55 | A | A | A | A | A | A | B | A | A |

Addition of Cu Crack Inhibitor or Cu Antioxidant

When 1 ppm of 3-mercaptopropionic acid was added to each of the chemical solutions of Examples 30 to 35 as a crack inhibitor for Cu surfaces, the evaluation of Cu surface cracking shown in Table 5 improved from "B" to "A". Similar effects were attained when 1 ppm of thiolactic acid, 2-amino-2-thiazoline, 2,4,6-trimercapto-s-triazine, or the like was added instead of 3-mercaptopropionic acid.

When benzotriazole was added as an antioxidant for Cu in amounts of 1 and 5 ppm, respectively, to the chemical solutions of Examples 13 and 28, Cu oxidation was prevented, as compared to when benzotriazole was not added.

The state of Cu oxidation was determined as follows: Cu blanket wafers after being immersed in the chemical solutions were maintained at 27° C. and a humidity of 80% or more for 24 hours or more, and then Cu peaks originating from CuO were observed by XPS (photoelectron spectroscopy) and compared with the peaks of the original blanket wafers.

These results show that the addition of a Cu crack inhibitor or a Cu antioxidant can impart a crack-prevention effect, or an oxidation-prevention effect. The same will also apply to the other Examples.

Comparative Examples 1 to 12

The concentrations of the residue-removing solutions of the Comparative Examples were almost equal to those for the Examples shown in Tables 2 and 4 (Table 6). Comparative Examples 1 to 5, Comparative Examples 6 to 10, and Comparative Examples 11 to 12 are compared with Examples 1 to 29, Examples 30 to 35, and Examples 36 to 55, respectively.

TABLE 6

| | Composition of Residue-Removing Solution | | | | | | |
|---|---|---|---|---|---|---|---|
| | | | | Composition of Polycarboxylic Acid Salt | | | |
| Comp. Ex. | Water (% by weight) | Acid or Salt (% by weight) | | Polycarboxylic Acid (% by weight) | | Base (% by weight) | |
| 1 | 99.4 | Ammonium Fluoride | 0.6 | — | — | — | — |
| 2 | 98.7 | Ammonium Acetate | 1.3 | — | — | — | — |
| 3 | 97.9 | Ammonium Oxalate | 2.1 | — | — | — | — |
| 4 | 97.7 | Ammonium Malonate | 2.3 | — | — | — | — |
| 5 | 95.9 | Triammonium Citrate | 4.1 | — | — | — | — |
| 6 | 99.7 | Hydrogen Fluoride | 0.3 | — | — | — | — |
| 7 | 99.4 | Hydrogen Chloride | 0.6 | — | — | — | — |
| 8 | 99.0 | Acetic Acid | 1.0 | — | — | — | — |
| 9 | 98.5 | Oxalic Acid | 1.5 | — | — | — | — |
| 10 | 98.3 | Malonic Acid | 1.7 | — | — | — | — |
| 11 | 99.0 | Acetic Acid | 0.5 | Malonic Acid | 1.5 | Ammonia | 0.5 |
| 12 | 98.7 | Oxalic Acid | 0.8 | Malonic Acid | 1.5 | Ammonia | 0.5 |

Table 7 shows the results of the tests using the chemical solutions of Comparative Examples 1 to 12.

All of the chemical solutions of Comparative Examples 1 to 12 were poor in their ability to prevent Cu cracking. The chemical solutions of Comparative Examples 6 to 10 caused degradation of the surface layers of the low-k films. In addition, as for the other items of Table 7, the evaluations of C or below indicate poor performance. Accordingly, none of the chemical solutions of Comparative Examples 1 to 12 listed in Table 6 were preferable as residue-removing solutions.

TABLE 7

| | Evaluations Using the Patterned Wafers | | | | | | Evaluations Using the Blanket Films | | |
|---|---|---|---|---|---|---|---|---|---|
| | Residue-Removing Performance | | | Evaluation of Via Hole Pattern Shapes (Immersion Time in the Chemical Solutions: 3 min) | | | Low-k Film (SiOC Film) | | |
| | Cu Surface | | | | | | Cu | | Surface Layer Degradation |
| Comp. Ex. | on Via Hole Bottom | Via Hole Side Walls | Substrate Surface | Cu Surface | Cu Surface Cracking | Side Walls | Corrosion Etching Rate | Etching | Change in Contact Angle |
| 1 | C | B | C | C | C | A | C | A | A |
| 2 | B | B | B | C | C | A | D | A | A |
| 3 | B | B | B | C | C | A | C | A | A |
| 4 | B | B | B | C | C | A | D | A | A |
| 5 | B | B | B | C | C | A | D | A | A |
| 6 | A | A | C | B | D | C | C | B | C |
| 7 | A | D | C | A | D | B | D | A | C |
| 8 | A | A | B | A | D | B | C | A | C |
| 9 | A | A | B | A | D | B | B | A | C |
| 10 | A | A | B | A | D | B | B | A | C |
| 11 | A | B | B | A | C | A | A | A | B |
| 12 | A | B | B | A | C | A | A | A | A |

The invention claimed is:

1. A residue-removing solution for removing residues present on semiconductor substrates after dry etching and/or ashing, the solution having a pH of from 2 to 7 and comprising water and at least one component selected from the group consisting of a salt formed from at least one acid selected from the group consisting of levulinic acid and 5-aminolevulinic acid, and at least one base selected from the group consisting of ammonia, hydroxylamine, methylamine, ethylamine, propylamine, butylamine, dimethylamine, diethylamine, trimethylamine, triethylamine, propanediamine, quaternary ammonium, and polyamines, wherein the proportion of water in the residue-removing solution is from 81.8 to 99.5% by weight.

2. The residue-removing solution according to claim 1, wherein the concentration of the salt formed from at least one acid selected from the group consisting of levulinic acid and 5-aminolevulinic acid, and at least one base selected from the group consisting of ammonia, hydroxylamine, methylamine, ethylamine, propylamine, butylamine, dimethylamine, diethylamine, trimethylamine, triethylamine, propanediamine, quaternary ammonium, and polyamines in the residue-removing solution is from 0.1 to 35% by weight.

3. The residue-removing solution according to claim 1, further comprising a polycarboxylic acid salt.

4. The residue-removing solution according to claim 3, wherein the concentration of the polycarboxylic acid salt in the residue-removing solution is from 0.1 to 10% by weight.

5. The residue-removing solution according to claim 3, wherein the polycarboxylic acid salt is a salt formed from at least one polycarboxylic acid selected from the group consisting of oxalic acid, malonic acid, succinic acid, glutaric acid, malic acid, tartaric acid, ammonium hydrogen citrate, and citric acid; and at least one base selected from the group consisting of ammonia, hydroxylamine, primary, secondary, and tertiary amines, quaternary ammonium, and polyamines.

6. The residue-removing solution according to claim 1, further comprising a neutral organic compound containing an oxygen atom that can coordinate to Cu.

7. The residue-removing solution according to claim 6, wherein the concentration of the neutral organic compound containing an oxygen atom that can coordinate to Cu is from 0.1 to 60% by weight, based on the total amount of the residue-removing solution.

8. The residue-removing solution according to claim 7, wherein the neutral organic compound containing an oxygen atom that can coordinate to Cu is at least one compound selected from the group consisting of polycarbonyls, esters, alcohols, and polyethers.

9. The residue-removing solution according to claim 6, wherein the neutral organic compound containing an oxygen atom that can coordinate to Cu is at least one compound selected from the group consisting of 2,3-butanedione, 2,4-pentadione, acetoin, propylene carbonate, γ-butyrolactone, ethylene glycol diacetate (ethylene diacetate), diethylene glycol monoethyl ether acetate, propylene glycol monomethyl ether acetate (PGMEA), propylene glycol monoethyl ether acetate, isopropyl alcohol, 1-butanol, isobutyl alcohol, diethylene glycol, dipropylene glycol, triethylene glycol, tetraethylene glycol, ethylene glycol dimethyl ether, diethylene glycol dimethyl ether, diethylene glycol diethyl ether, triethylene glycol dimethyl ether, tetraethylene glycol dimethyl ether, methyl acetoacetate, ethyl acetoacetate, and ethyl lactate.

10. The residue-removing solution according to claim 1, further comprising a surfactant.

11. The residue-removing solution according to claim 1, further comprising a fluorine compound.

12. The residue-removing solution according to claim 11, wherein the fluorine compound is hydrogen fluoride, or a fluoride salt of ammonia, hydroxylamine, a primary, secondary, or tertiary amine, quaternary ammonium, or a polyamine.

13. The residue-removing solution according to claim 1, further comprising a crack inhibitor for Cu and/or an antioxidant for Cu.

14. A method for removing residues present on semiconductor substrates after dry etching and/or ashing, the method comprising bringing a semiconductor substrate after dry etching and/or ashing into contact with the residue-removing solution of claim 1.

15. The method according to claim 14, wherein the semiconductor substrate has Cu as an interconnect material, and a low dielectric constant film (a low-k film) as an interlayer dielectric material.

16. A method for manufacturing semiconductor devices comprising the steps of:
(1) subjecting a semiconductor substrate having Cu as an interconnect material, and a low dielectric constant film (a low-k film) as an interlayer dielectric material, to dry etching and/or ashing; and
(2) bringing the semiconductor substrate processed in Step (1) into contact with the residue-removing solution of claim 1.

17. A residue-removing solution for removing residues present on semiconductor substrates after dry etching and/or ashing, the solution consisting of water, and at least one component selected from the group consisting of (a) a keto acid, (b) a keto acid salt, and (C) an aldehyde acid salt.

18. A residue-removing solution for removing residues present on semiconductor substrates after dry etching and/or ashing, the solution consisting of water, a polycarboxylic acid salt, and at least one component selected from the group consisting of (a) a keto acid, (b) a keto acid salt, and (C) an aldehyde acid salt.

19. A residue-removing solution for removing residues present on semiconductor substrates after dry etching and/or ashing, the solution consisting of water, a polycarboxylic acid salt, a neutral organic compound containing an oxygen atom that can coordinate to Cu, a fluorine compound, and at least one component selected from the group consisting of (a) a keto acid, (b) a keto acid salt, and (C) an aldehyde acid salt.

* * * * *